United States Patent [19]

Ikeda et al.

[11] Patent Number: 5,055,420

[45] Date of Patent: * Oct. 8, 1991

[54] PROCESS FOR FABRICATING SEMICONDUCTOR INTEGRATED CIRCUIT DEVICES

[75] Inventors: Shuji Ikeda, Koganei; Kouichi Nagasawa, Kunitachi; Makoto Motoyoshi, Fucyu; Kiyoshi Nagai, Koganei; Satoshi Meguro, Hinode, all of Japan

[73] Assignee: Hitachi, Ltd., Tokyo, Japan

[ * ] Notice: The portion of the term of this patent subsequent to Mar. 29, 2005 has been disclaimed.

[21] Appl. No.: 351,323

[22] Filed: May 9, 1989

Related U.S. Application Data

[62] Division of Ser. No. 141,501, Jan. 7, 1988, abandoned, which is a division of Ser. No. 800,954, Nov. 22, 1985, Pat. No. 4,734,383.

[30] Foreign Application Priority Data

Nov. 22, 1984 [JP] Japan ............................... 59-246028
Feb. 8, 1985 [JP] Japan ................................ 60-21673

[51] Int. Cl.$^5$ .......................................... H01L 21/265
[52] U.S. Cl. ......................................... 437/34; 437/57; 437/58
[58] Field of Search ..................... 437/30, 34, 57, 58, 437/933, 938

[56] References Cited

U.S. PATENT DOCUMENTS

| | | | |
|---|---|---|---|
| 4,045,250 | 8/1977 | Dingwall | 437/34 |
| 4,046,607 | 9/1977 | Inoue et al. | 148/187 |
| 4,224,733 | 9/1980 | Spadea | 437/34 |
| 4,342,149 | 8/1982 | Jacobs et al. | 437/30 |
| 4,364,075 | 12/1982 | Bohr et al. | 357/23 C |
| 4,366,613 | 1/1983 | Ogura et al. | 437/69 |
| 4,369,072 | 1/1983 | Bakeman, Jr. et al. | 437/30 |
| 4,435,896 | 3/1984 | Parrillo et al. | 357/42 X |
| 4,516,313 | 5/1985 | Turi et al. | 357/42 |
| 4,535,532 | 8/1985 | Lancaster | 437/34 |
| 4,549,340 | 10/1985 | Nagasawa et al. | 357/42 |
| 4,554,729 | 11/1985 | Tanimura et al. | 437/52 |
| 4,560,582 | 12/1985 | Ichikawa | 357/23.3 X |
| 4,613,885 | 9/1986 | Haken | 437/34 |
| 4,734,383 | 3/1988 | Ikeda et al. | 437/42 |

FOREIGN PATENT DOCUMENTS

| | | | |
|---|---|---|---|
| 2372511 | 6/1978 | France . | |
| 53-123084 | 10/1978 | Japan | 357/20 |
| 2106621 | 5/1987 | Japan | 437/30 |
| 2034974 | 6/1980 | United Kingdom . | |
| 2092826 | 8/1982 | United Kingdom | 437/52 |

OTHER PUBLICATIONS

Toker, J. R., "Fabrication and Characterization of E--Beam Defined MOSFETs . . . " IEDM Tech Dig. Dec. 1980, pp. 768-771.

Primary Examiner—Olik Chaudhuri
Assistant Examiner—G. Fourson
Attorney, Agent, or Firm—Antonelli, Terry, Stout & Kraus

[57] ABSTRACT

After contact holes for the P- and N-type source or drain regions of P- and N-channel MOSFETs have been made at a common step, an N-type impurity is ion-implanted into at least the N-type source or drain regions through the contact holes. The N-type impurity is annealed to fornm an N-type region which is deeper than the N-type source or drain regions. During the annealing treatment, the N-type source or drain regions are covered with an insulating film.

37 Claims, 4 Drawing Sheets

PROCESS FOR FABRICATING SEMICONDUCTOR INTEGRATED CIRCUIT DEVICES

This application is a divisional application of application Ser. No. 07/141,501, filed Jan. 7, 1988 now abandoned, which is a divisional application of application Ser. No. 800,954, filed Nov. 22, 1985 now U.S. Pat. No. 4,734,383.

BACKGROUND OF THE INVENTION

The present invention relates to a semiconductor integrated circuit device and, more particularly, to a process for fabricating a semiconductor integrated circuit device which has a junction of a semiconductor region that is prevented from being destroyed.

In accordance with increasing integration of semiconductor devices such as IC's or LSI's in recent years, the element of these devices are made finer and finer. In the MOS type semiconductor device, the MOSFET (i.e., Metal Oxide Semiconductor Field Effect Transistor) has been scaled down, i.e., has its channel shortened. In accordance with this shortened channel, the semiconductor region (e.g., source or drain regions) of the element has its junction depth decreased to about 0.2 to 0.4 microns.

The semiconductor region is connected with aluminum used as a wiring layer. The heat treatment for establishing ohmic contact between the aluminum and the semiconductor region (Si) causes the so-called "alloy spike", in which the aluminum sinters into the substrate. When this alloy spike reaches the PN junction, this junction is short-circuited, or leakage current increases. As a result, the element is made less reliable. Thus, in the recent MOSFET which has its junction depth reduced year by year, as has been described above, a variety of trials have been made to suppress or prevent the junction destruction due to the alloy spike. One of the proposed methods is that the junction depth at the contact hole portion is locally enlarged by diffusing an impurity into the semiconductor region of the same conductivity type through contact holes. This method is simple, requiring only one step, and is effective.

This method is disclosed, for example, in the "Special Issue of Nikkei Electronics", pp. 122, which issued on Aug. 23, 1983 by Nikkei McGraw Hill Co., Ltd. (published in Japan).

According to our investigations, in case the aforementioned method is applied as it is to such a semiconductor device (such as a CMOS device having P-channel MOSFETs and N-channel MOSFETs), that has a P-type semiconductor region and an N-type semiconductor region, the large number of steps for fabricating the CMOS device is further increased.

SUMMARY OF THE INVENTION

An object of the present invention is to provide a process for fabricating a semiconductor device, which can prevent any junction from being destroyed easily without any substantial increase in the number of steps.

Another object of the present invention is to improve the connection between a polycrystalline silicon layer, a refractory metal silicide layer or a polycide layer and an aluminum layer.

A further object of the present invention is to provide a technique which can reduce the resistance at the connection between a semiconductor region and a conductive layer thereby to speed up the operation speed of a semiconductor integrated circuit device.

The aforementioned and other objects and novel features of the present invention will become apparent from the following description taken with reference to the accompanying drawings.

The summary of one representative of the invention to be disclosed herein will be briefly described in the following.

After both a contact hole for connecting a semiconductor region of first conductivity type and a conductive layer and a contact hole for connecting a semiconductor region of second conductivity type and a conductive layer have been formed at a common step, an impurity of first conductivity type is introduced by ion-implantation into the semiconductor region of first conductivity type. As a result, the number of steps of forming the contact holes can be reduced to one.

DESCRIPTION OF THE PREFERRED EMBODIMENTS

Figure 1:
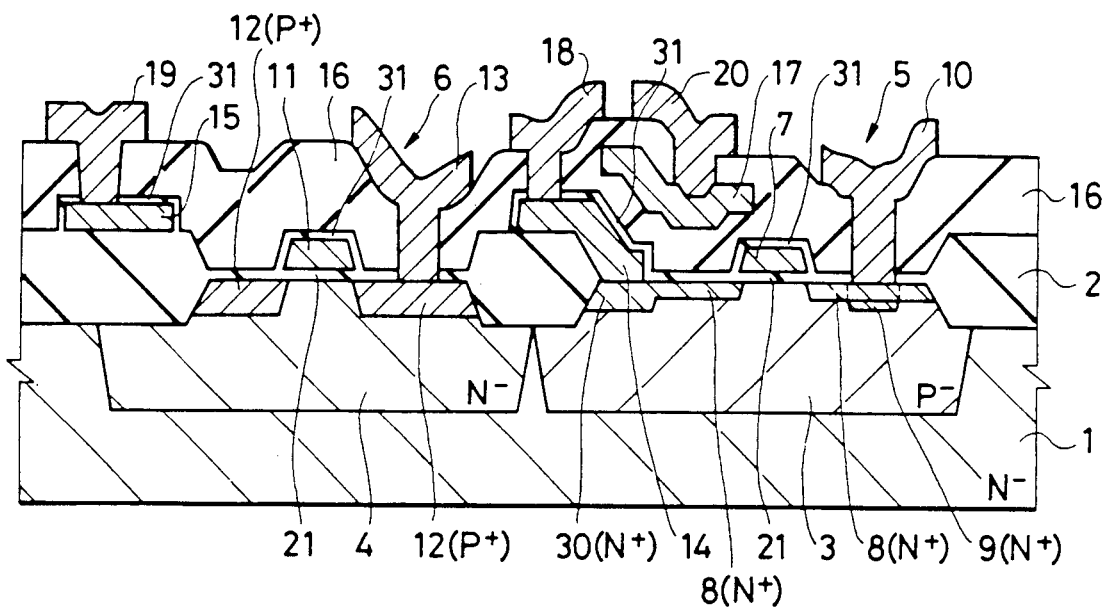
FIG. 1 is a sectional view showing a CMOS type semiconductor integrated circuit device of the present invention.

FIG. 1 shows a semiconductor integrated circuit device having the CMOS structure of the present invention.

A region for forming a MOSFET is defined by a field insulating film (or $SiO_2$) 2 which is formed on a semiconductor substrate 1 made of N-type silicon single crystal. In a $P^-$-type well region 3 and an $N^-$-type well region 4 formed on the semiconductor substrate 1, respectively, there are formed an N-channel MOSFET 5 and a P-channel MOSFET 6.

The N-channel MOSFET 5 comprises a gate insulating film 21 made of a silicon oxide film, a gate electrode 7 made of polycrystalline silicon and an $N^+$-type source or drain region 8 which is formed by ion-implanting an N-type impurity such as arsenic (As). The source or drain region 8 has a junction depth of about 0.2 microns. Below a portion of the region 8 (or below the contact holes), there is formed locally deep an $N^+$-type semiconductor region 9, which is connected with aluminum wiring 10.

The P-channel MOSFET 6 comprises a gate insulating film 21 made of a silicon oxide film, a gate electrode 11 made of polycrystalline silicon and a $P^+$-type source or drain region 12 which is formed by ion-implanting a P-type impurity such boron (B). This source or drain region 12 has a junction depth of about 0.4 microns. Aluminum wiring 13 is connected with the region 12.

There are also formed wirings 14 and 15 which are made of a first-level polycrystalline silicon film formed simultaneously with the aforementioned respective gate electrodes 7 and 11. The first-level polycrystalline silicon films 7, 11, 14 and 15 are made to have low resistance by introducing an N-type impurity such as phosphorous. $N^+$-type semiconductor region 30 is formed by diffusing the phosphorous from the wiring 14 into the substrate (i.e., the well 3). This region 30 provides the connection between the region 8 and the wiring 14. The polycrystalline silicon films 7, 11, 14 and 15 are covered with a silicon oxide film 31.

Reference numeral 17 indicates a second-level polycrystalline silicon film, and numerals 18, 19 and 20 indicate aluminum wiring which is formed simultaneously with the wiring 10 and 13. Numeral 16 indicates an interlayer insulating film which is made of a phosphosilicate glass (i.e., PSG) film, for example, This, PSG film 16 comprises a film 16A (see FIG. 2C) formed between the first- and second-level polycrystalline silicon films and a film 16B (see FIG. 2C) formed between the second-level polycrystalline silicon film and the aluminum wiring.

FIGS. 2A to 2E are sectional views showing fabrication steps for explaining the process for fabricating the semiconductor integrated circuit device of FIG. 1.

Throughout the Figures, parts and portions having identical functions are indicated at common reference numerals, and their repeated descriptions will be omitted.

Figure 2A:
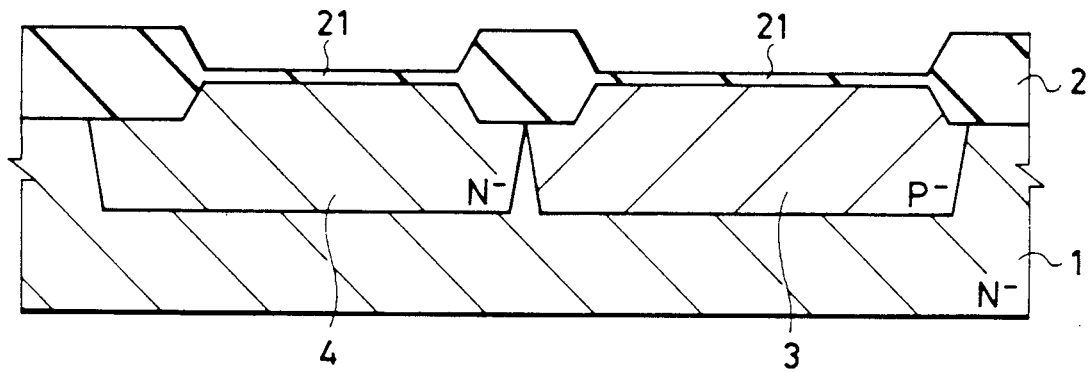
FIGS. 2A to 2E are sectional views showing fabrication steps for explaining one embodiment of the present invention.

As shown in FIG. 2A, the $N^-$-type semiconductor substrate 1 made of single crystal silicon is prepared. The $P^-$-type and $N^-$-type well regions 3 and 4 are formed on predetermined parts of a main surface of the semiconductor substrate 1. The field insulating film 2 is formed on the main surface of the semiconductor substrate 1, other than regions to be formed with semiconductor elements, by a selective thermal oxidation of the silicon. As shown in FIG. 2A, the insulating film 21 is formed on the semiconductor substrate 1. The insulating film 21 is adapted to construct the gate insulating film of the MOSFET and is made of a silicon oxide film which is formed by thermal oxidation, for example. After that, the insulating film 21 is partially etched off so as to connect the MOSFET 5 and the wiring 14.

After the step of forming the insulating film 21 shown in FIG. 2A, the conductive layers 7, 11, 14 and 15 are formed on the insulating film 21. The conductive layers 7, 11, 14 and 15 are formed by introducing phosphorous into the polycrystalline silicon film, which is formed all over the substrate by CVD, for example, and by selectively etching the polycrystalline silicon film. The conductive layers 7, 11, 14 and 15 thus formed are first-level conductive layers at the fabrication steps.

The silicon oxide film 31 is formed by thermally oxidizing the conductive layers 7, 11, 14 and 15. At this time, the phosphorous diffuses from the conductive layer 14 into the well 3 to form the $N^+$-type semiconductor region 30.

The conductive layers 7, 11, 14 and 15 may be formed by a film of refractory metal (e.g., Mo, Ta, Ti or W), silicides of the former (i.e., $MoSi_2$, $TaSi_2$, $TiSi_2$ or $WSi_2$), or a combination of the former and polycrystalline silicon film.

Figure 2B:
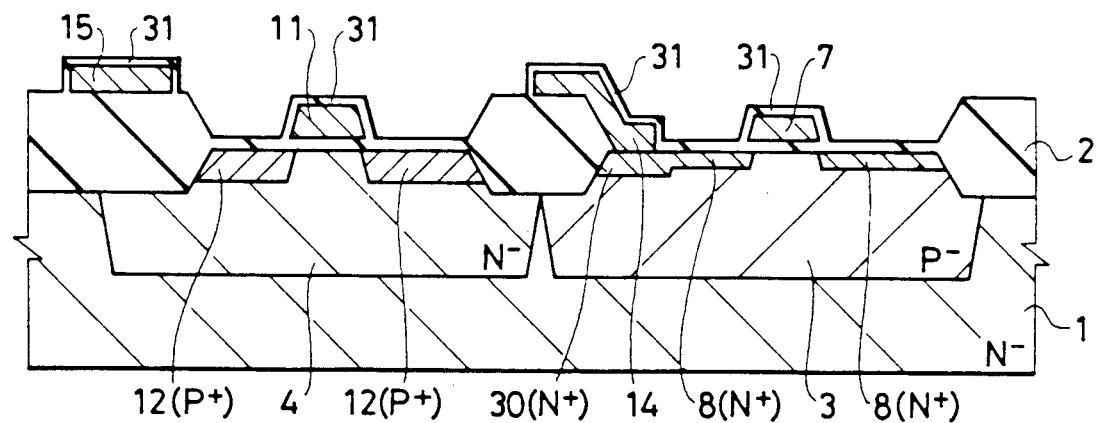

Next, as shown in FIG. 2B, the $N^+$-type semiconductor regions 8 are formed on the main surfaces of the well 3 at both the sides of the conductive layer 7. In the state in which at least the region to be formed with the MOSFET 6 is covered with a mask, arsenic, for example, is ion-implanted with a dosage of $1 \times 10^{16}/cm^2$. After an annealing treatment, the regions 8 have a junction depth of 0.2 microns, for example, and a concentration of $1 \times 10^{21}/cm^3$, for example.

Next, as shown in FIG. 2B, the $P^+$-type semiconductor regions 12 are formed on the main surfaces of the well region 4 at both the sides of the conductive layer 11. For example, with the MOSFET 5 and the wiring 14 and 15 being covered with a mask, boron, for example, is ion-implanted with a dosage of $2 \times 10^{15}/cm^2$. During such doping, the conductive layer 11 is counter-doped with boron. After an annealing treatment, the regions 12 have a junction depth of 0.4 microns, for example, and a concentration of $1 \times 10^{20}/cm^3$.

Figure 2C:
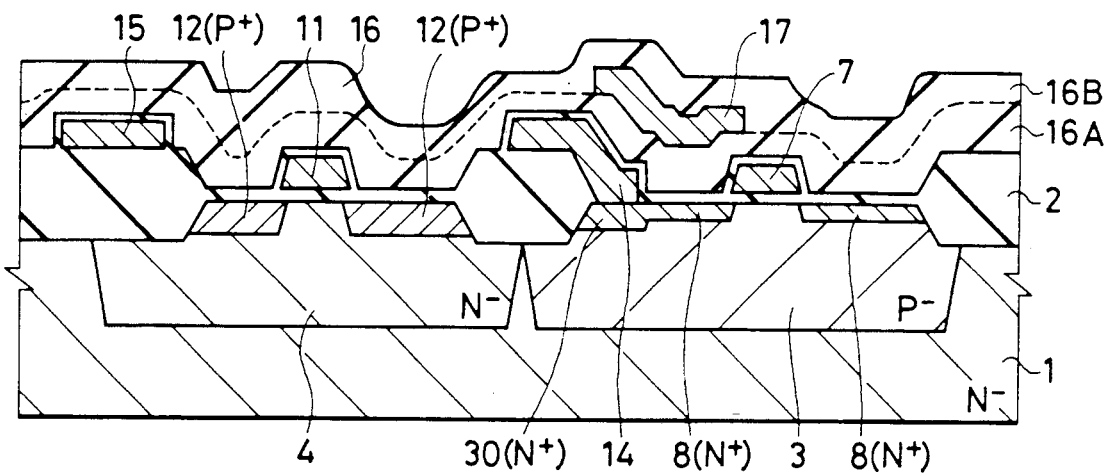

After this, as shown in FIG. 2C, the insulating film 16A is formed to cover both the semiconductor elements such as the MOSFETs 5 and 6 and the wirings 14 and 15. The insulating film 16A thus formed comprises a PSG film which is formed by CVD.

The polycrystalline silicon film 17 is formed on the insulating film 16A. The polycrystalline silicon film 17 is adapted to form a second-level conductive layer in the fabrication steps. A part of the polycrystalline silicon film 17 is used as a resistor element by having its impurity concentration reduced as compared to the impurity concentration of the remainder of polycrystalline silicon film 17 (or by introducing no impurity thereto).

The PSG film 16B is formed to cover the polycrystalline silicon film 17.

Figure 2D:
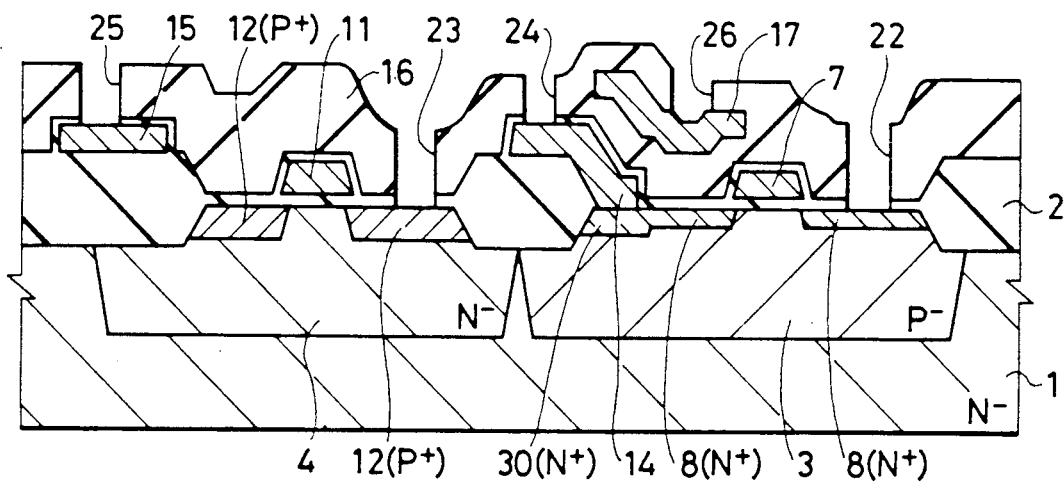

Next, as shown in FIG. 2D, the insulating films 16 including the insulating films 16A and 16B, 21 and 31 are selectively etched to form contact holes 22 to 26. More specifically, the contact hole 22 for the source or drain region 8 of the N-channel MOSFET 5 and the contact hole 23 for the source or drain region 12 of the P-channel MOSFET 6 are formed during a common step. The contact holes are formed by a dry etching. The remaining contact holes 24, 25 and 26 for the polycrystalline silicon films 14, 15 and 17 are also formed during the same step. In other words, the number of steps of forming those contact holes can be reduced to one.

Figure 2E:
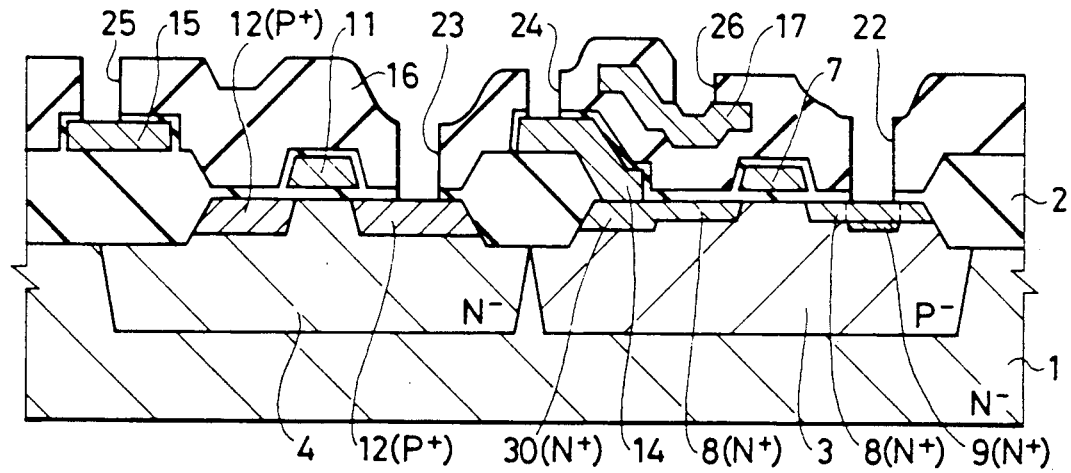

In the present embodiment, as shown in FIG. 2E, moreover, with all the contact holes 22, 23, 24, 25 and 26 being open, an N-type impurity such as phosphorous is ion-implanted all over the surface. In this case, the dosage of the phosphorous is determined considering the impurity concentration of the semiconductor region 12. Specifically, the phosphorous is introduced with a dosage of $5 \times 10^{14}/cm^2$ to set the impurity concentration of the $N^+$-type semiconductor region 9 at $1 \times 10^{20}/cm^3$ or lower. As a result, the phosphorous having a higher diffusion velocity than the arsenic is introduced into the region 8 so that it is diffused deep into the portion corresponding to the contact hole 22 to locally form the $N^+$-type semiconductor region 9 having a deep junction, as shown in FIG. 2E. Conversely, in the P-type region 12, the N-type impurity does not reach the N-type well region partly because the phosphorous has a lower diffusion velocity than the boron and partly because concentration of the phosphorous is lower than that of the boron.

After that, an aluminum film containing a small amount of silicon is sputtered to deposit on all over the substrate. The aluminum film is selectively etched to form the aluminum wirings 10, 13, 18, 19 and 20 shown in FIG. 1. Then, a passivation film is also formed on the substrate, although not shown.

Since the junction depth is enlarged especially at the $N^+$-type semiconductor region 8 by the ion-implantation of the phosphorous, according to the present embodiment, no alloy spike occurs. The $P^+$-type semiconductor region 12 is also freed from the alloy spike partly because it has a deep junction due to the high diffusion velocity of boron and partly because aluminum is a P-type impurity. Moreover, the number of steps of forming the contact holes may be reduced to one. It is unnecessary to form another mask when ion-implantation for the region 9 is conducted.

According to this embodiment, in case the contact holes for the P- and N-type semiconductor regions are formed in a common step, the introduction of the impurity for forming the region 9 may preferably be effected not by diffusion but by ion implantation.

This is because the introduction by diffusion will raise the following problems.

First of all, since diffusion makes it difficult to accurately determine the amount of an impurity to be introduced, the method that the N-type impurity is also introduced into the P-type semiconductor region, as shown in FIGS. 2A to 2E, cannot be used. In other words, a simple method requiring no mask for introducing the impurity cannot be used.

Secondly, since diffusion has to be accompanied by a heat treatment, a resist film which can be formed at a simple step cannot be used as a mask for impurity introduction. In other words, in order to prevent the N-type impurity from being introduced into the P-type semiconductor region, it is necessary to use a heat resisting film such as a silicon oxide film as the mask. In this case, however, the addition of the steps of forming and removing the mask will lead to the loss of the advantage which has been attained as a result of forming the contact holes at one step. When the mask and the interlayer insulating film 16 have similar etching rates, moreover, it becomes difficult to remove the mask only.

Figure 3:
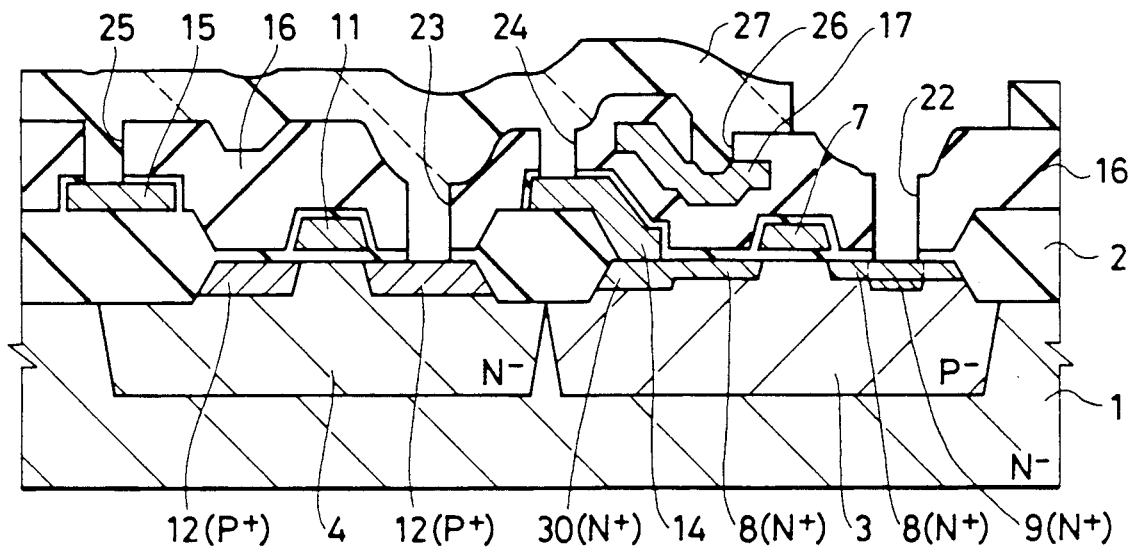
FIGS. 3 to 6 are sectional views for explaining other embodiments of the present invention, respectively.

FIG. 3 shows another embodiment of the present invention, which provides another method of fabricating the aforementioned CMOS device of FIG. 1.

Like the foregoing embodiment, the contact holes 22, 23, 24, 25 and 26 shown in FIG. 2D are formed. Then, a mask 27 which is made of a resist is formed so as to open the N+-type region 8, i.e., the contact hole 22, and to cover the remaining the contact holes 23, 24, 25 and 26. In this state, an N-type impurity such as phosphorous is ion-implanted so that it can be introduced into the N+-type region 8 only. As a result, the N+-type semiconductor region 9 can be formed in the N+-type region 8 especially below the contact hole 22 to enlarge the junction depth. Since, in this case, no phosphorous is introduced into the P+-type region 12, the dosage of the phosphorous need not take the ion dosage of the P-type region 12 into consideration. This makes it possible to implant ion with a sufficient dose, i.e., a dosage of $5 \times 10^{15}/cm^2$ or more and a concentration of $10^{20}/cm^3$ or more thereby to form a junction deep enough for preventing alloy spike. Only one step of forming the resist is added to the process; however, this does not complicate the process. The contact resistance between the P+-type region 12 and the aluminum wiring 13 can be reduced.

The mask 27 to be used for ion-implantation to form the region 9 may desirably be made of a resist film. When the resist film is used, the mask can be finished by coating, exposing and developing treatment, and the removal of the mask can be facilitated. When a film having no photosensitivity such as a silicon oxide film is used, it is not easy to form and remove the mask. Especially the advantage obtained by forming the contact holes at one step is lost by the addition of the etching step for removing the mask.

Figure 4:
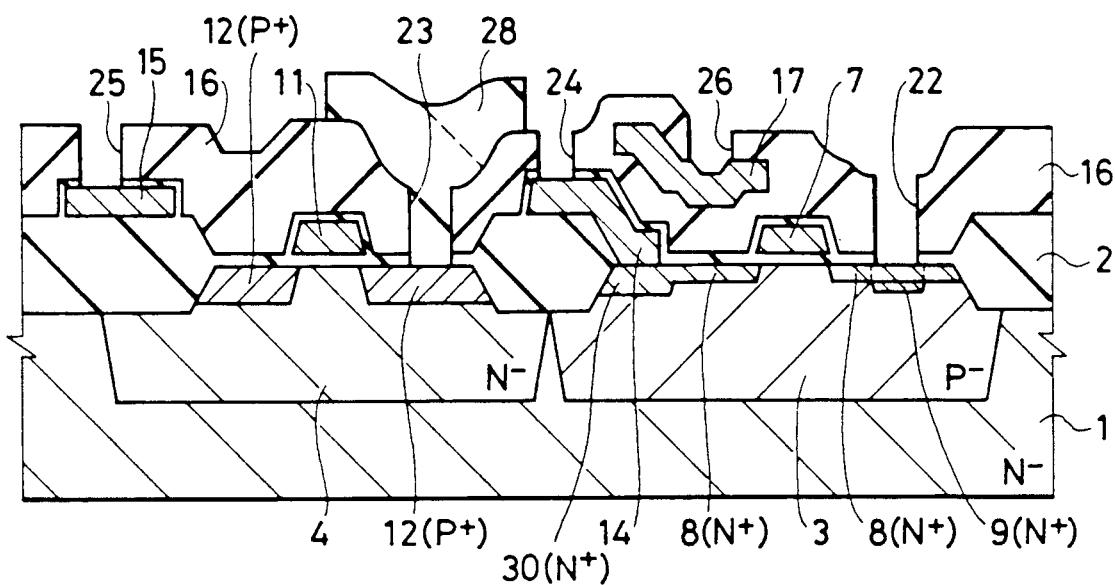

FIG. 4 shows a partial modification of the process of FIG. 3, in which a resist 28 is formed to cover only the contact hole 23 of the P+-type region 12.

In this embodiment, too, it is unnecessary to consider the ion-implantation of the phosphorous P into the P−-type region 12 when the phosphorous is to be implanted as the N-type impurity. This makes it possible to form the N+-type region 9 with a necessary dosage thereby to retain a junction depth sufficient for preventing alloy spike in the N+-type region 8.

Moreover, the phosphorous can be sufficiently ion-implanted into the polycrystalline silicon films 14 and 15 and the second polycrystalline silicon film 17 through the contact holes 24, 25 and 26 to raise the impurity concentrations in the contact portions. As a result, the contact resistance can be reduced to improve the connections with the aluminum wirings 18, 19 and 20. Especially in the polycrystalline silicon film 15 in the vicinity of the P-channel MOSFET 6, the N-type impurity concentration is decreased by the ion-implantation of the boron to form P+-type region 12. By reintroducing the phosphorous, therefore, the impurity concentration can be raised to ensure the aforementioned improved connections.

Figure 5:
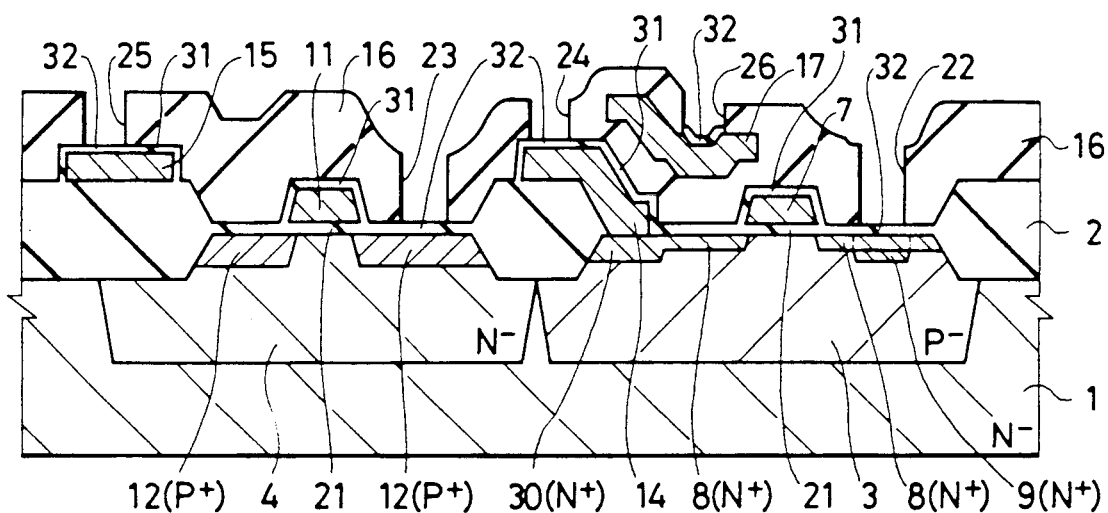

FIG. 5 shows still another embodiment of the present invention, which exemplifies still another process for fabricating the aforementioned CMOS device shown in FIG. 1.

The contact holes 22 to 26 are formed by conducting the steps at and before that shown in FIG. 2D. After this, an insulating film 32 is formed on the silicon surface which is exposed in the contact holes.

The insulating film 32 is provided to prevent the impurity, which has been introduced to form the region 9, from diffusing into the atmosphere during its drive-in diffusion step. The insulating film 32 also acts to prevent the impurity diffusing into the atmosphere, if any, from being introduced into the main surface of the semiconductor region 12. The insulating film 32 has another effect of suppressing the damage of the main surface of the semiconductor region 8 due to the introduction of the impurity for forming the region 9.

The insulating film 32 is a silicon oxide film having a thickness of about 10 nm, which is formed by thermal oxidation at a temperature of about 900° C. and for a period of about 20 minutes, for example.

On the other hand, the insulating film 32 may be made of a silicon oxide or nitride film which is formed by CVD, for example.

After that, an N-type impurity is introduced into the main surface of the semiconductor region 8 through the insulating film 32. This impurity introduction may be effected by ion-implantation using a dosage of $5 \times 10^{14}$ phosphorous ions/$cm^2$ and an energy of about 50 KeV, for example. Since this impurity is introduced through the insulating film 32, it is possible to suppress the damage of the principal surface of the semiconductor region 8 due to the introduction.

After that, the impurity thus introduced is subjected to drive-in diffusion treatment (or annealing treatment) to form the N+-type semiconductor region 9 which has a deeper junction than that of the semiconductor region 8. The semiconductor region 9 is formed by the drive-in diffusion treatment at a temperature of 950° C. and for a period of about 20 minutes, for example.

Thanks to the formation of the insulating film 32, the N-type impurity for forming the semiconductor region 9 can be prevented from diffusing into the atmosphere from the semiconductor region 8 during the drive-in diffusion steps. Even if the N-type impurity should diffuse into the atmosphere, it can be prevented from diffusing into the main surface of the semiconductor region 12 through the contact hole 23 by the insulating film 32. In other words, it is possible to avoid the reduction of the impurity concentration in the main surface of the semiconductor region 12 at the contact hole 23 thereby to reduce the resistance of the connection with the aluminum film to a value as small as 30 ohms/square microns. As a result, the semiconductor integrated circuit device can have the resistance of the whole wiring reduced so as to increase its operation speed.

After the step of forming the semiconductor region 9, the insulating film 32 is removed. This removal can be effected merely by washing the substrate as a whole because the insulating film 32 is made thin. This washing step can be replaced by a rinsing step which is conducted before the aluminum film is formed.

When ion-implantation is conducted after the contact holes have been formed at one step, it is desired to form the insulating film 32 because the annealing treatment after the ion-implantation is essential. The resist film (as shown in FIG. 3 or 4) to be used as the mask for the ion implantation cannot be used as the insulating film 32. This insulating film 32 may preferably be exemplified by the silicon oxide film which can be formed in self-alignment with the contact hole by thermal oxidation.

According to the novel technique disclosed hereinbefore, it is possible to achieve the following effects.

After the contact holes of the CMOS device have been formed in one step, the N-type impurity is ion-implanted into the surface, all over the surface, in a lower dosage than that of the P-type region. This makes it possible to form a deep junction locally in the N-type region without any compensation of the P-type region thereby to prevent alloy spike due to the contacts with the aluminum and to improve the reliability of the semiconductor device.

The contact holes are formed in one step, and a mask for the ion-implantation is not used, so that the fabrication steps can be simplified.

Since ion-implantation of the N-type impurity is conducted with at least the contact holes of the P-type region being covered with a mask, the P-type source and drain regions are not compensated even if ion-implantation is conducted with a higher dosage than that of the P-type region. This makes it possible to effect a sufficient extent of ion-implantation of the N-type impurity into the N-type region thereby to form a junction sufficiently deep to prevent alloy spike.

Since it is sufficient to add the step of forming the resist film to be used as the mask for ion-implantation, the process of the present invention need not be accompanied by an abrupt increase in the number of steps, so that it can be practiced more easily than the other processes for preventing alloy spike. Since the mask for ion-implantation can be formed of the resist film, the steps can be simplified.

Since ion-implantation into the polycrystalline silicon film is conducted simultaneously with ion-implantation of the N-type impurity into the N-type source and drain regions, it is possible to reduce the resistance of the polycrystalline silicon thereby to improve the connection thereof with the aluminum contacts.

Thanks to the formation of the insulating film after the contact holes are formed, it is possible to eliminate the outward diffusion of the N-type impurity due to the annealing treatment after ion-implantation. Since that insulating film is made of the silicon oxide film prepared by thermal oxidation, moreover, the steps can be further simplified.

Although the invention conceived by us has been specifically described hereinbefore in connection with the embodiments thereof, it should not be limited to the embodiments but can naturally be modified in various ways without departing from the gist thereof.

Figure 6:
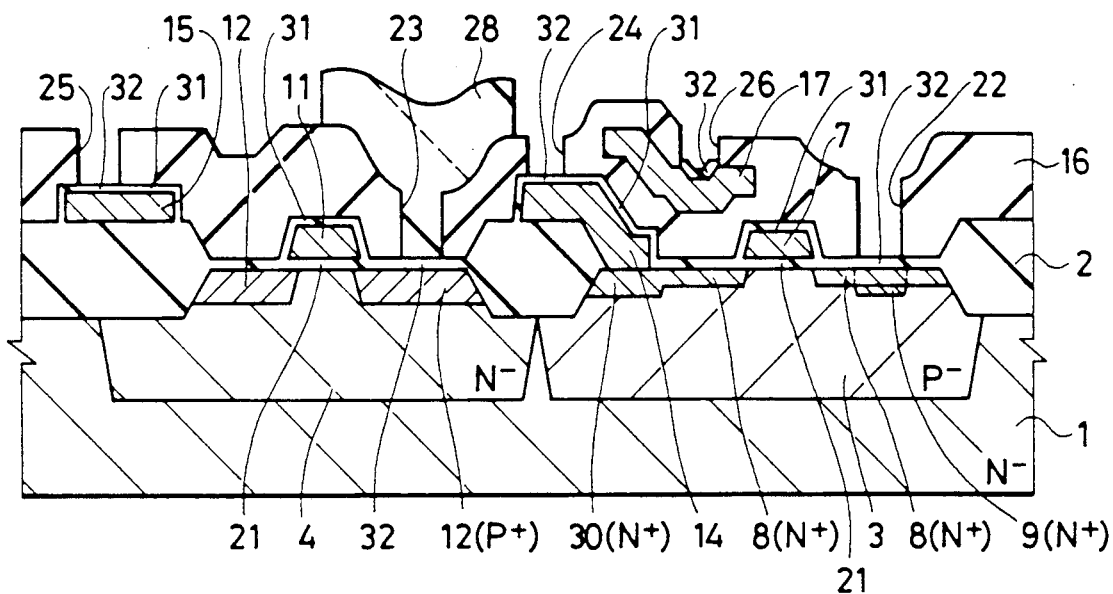

For example, the region 9 may be formed by the process shown in FIG. 6. FIG. 6 shows an example, in which the processes shown in FIGS. 5 and 4 are both practiced. Specifically, the insulating film 32 made of silicon oxide is formed by thermal oxidation, and the mask 28 for the ion-implantation is made of the resist film. According to this example, it is possible to freely set the dosage of the ion-implantation for forming the region 9. It is also possible to decrease the connection resistance of the polycrystalline silicon layer. It is further possible to eliminate diffusion of the impurity (such as phosphorous) into the atmosphere during the annealing treatment for forming the region 9.

The insulating film 32 may be formed by leaving a part of the insulating film 21, when the latter is to be removed, at the step of forming the contact holes 22 and 23. Incidentally, the insulating film 32 thus formed has its thickness dispersed due to the dispersions of the thickness of the insulating film 21 and the etching dispersions of the contact holes. The present example is therefore effective for the process shown in FIG. 6, in which the dosage of the ion-implantation can be enlarged to an arbitrary value.

Arsenic may be used as the N-type impurity. The present invention can also be applied to not only the source or drain region of the MOSFET but also semiconductor region such as the substrate contact region or a well contact region. The polysilicon layer may be made of a layer of refractory metal, or its silicide layer, or a two-layered structure which comprises a polysilicon layer and a layer formed thereon and made of refractory metal or its silicide. The polycrystalline silicon layers 14 and 15 and the second polycrystalline silicon layer 17 need not be formed as the wiring.

It is sufficient to form the contact holes 22 and 23 in one step, but it is not always necessary to form the contact holes 24, 25 and 26 in the same step.

The present invention can also be applied to a P-type semiconductor region.

As shown in FIG. 6, moreover, the aforementioned respective examples can be applied in combination.

Still moreover, the wiring layers to be connected with the semiconductor regions may be made of metal other than aluminum.

What is claimed is:

1. A process for fabricating a semiconductor integrated circuit device, comprising the steps of:
    (a) forming a first insulating film covering an N-channel MOSFET having n-type semiconductor regions and a P-channel MOSFET having p-type semiconductor regions, the MOSFETs being provided on a main surface of a semiconductor substrate;
    (b) simultaneously forming at least two contact holes in said first insulating film, said at least two contact holes being formed to at least each of an n-type semiconductor region of the n-channel MOSFET and a p-type semiconductor region of the p-channel MOSFET;

(c) forming a mask covering at least one contact hole, of the contact holes, on said p-type semiconductor region of the P-channel MOSFET;

(d) introducing a n-type impurity into at least said n-type semiconductor region through at least one contact hole, 1 of the contact holes, and then annealing, said introducing and annealing being performed so as to provide a further n-type semiconductor region that extends deeper than said n-type semiconductor region; and (e) forming a conductive film in the contact holes.

2. A process according to claim 1, wherein said introducing the impurity is performed by ion-implantation.

3. A process according to claim 2, wherein the impurity is ion-implanted at a concentration lower than the concentration of the p-type impurity in the p-type semiconductor regions.

4. A process according to claim 3, wherein the impurity is ion-implanted through the at least two contact holes into both the n-type semiconductor regions and the p-type semiconductor regions.

5. A process according to claim 3, wherein said p-type and n-type semiconductor regions include boron and arsenic as the p-type and the n-type impurity, respectively.

6. A process according to claim 5, wherein the n-type impurity for providing the further n-type semiconductor region is phosphorous.

7. A process according to claim 1, wherein the mask covering the at least one contact hole on the p-type semiconductor region is formed prior to introducing the n-type impurity.

8. A process according to claim 7, wherein said mask is a resist film.

9. A process according to claim 7, wherein said first insulating film also covers a second conductive layer formed over said main surface of said semiconductor substrate, and said at least two contact holes include contact holes formed to the second conductive layer.

10. A process according to claim 9, wherein said second conductive layer is formed of polycrystalline silicon.

11. A process according to claim 1, wherein said mask is made of a resist material.

12. A process according to claim 11, wherein the step of forming the mask includes forming a layer of photoresist material over the substrate, selectively exposing the layer of photoresist material, and selectively removing the layer of photoresist material so as to form said mask.

13. A process according to claim 1, wherein said mask covers only said at least one contact hole on said p-type semiconductor region of the P-channel MOSFET.

14. A process according to claim 1, wherein said N-channel MOSFET and said P-channel MOSFET constitute complementary MOSFETs of said semiconductor integrated circuit device.

15. A process for fabricating a semiconductor integrated circuit device, comprising the steps of:

(a) forming a first insulating film covering an N-channel MOSFET having n-type semiconductor regions and a P-channel MOSFET having p-type semiconductor regions, the MOSFETs being provided on a main surface of a semiconductor substrate;

(b) simultaneously forming at least two contact holes in said first insulating film, said contact holes being formed to at least each of an n-type semiconductor region of the N-channel MOSFET and a p-type semiconductor region of the P-channel MOSFET;

(c) ion-implanting an n-type impurity into at least said n-type semiconductor region through at least one contact hole, of said contact holes, and then annealing, said ion-implanting and annealing being performed so as to provide a further n-type semiconductor region that extends deeper than said n-type semiconductor region; and (d) forming a conductive film in the contact holes.

16. A process according to claim 15, wherein said p-type and n-type semiconductor regions include boron and arsenic as the p-type and the n-type impurity, respectively.

17. A process according to claim 16, wherein the n-type impurity for the further n-type semiconductor region is phosphorous.

18. A process according to claim 15, wherein the n-type impurity is ion-implanted at a concentration lower than the concentration of the p-type impurity in the p-type semiconductor region.

19. A process according to claim 18, wherein the n-type impurity is ion-implanted through the at least two contact holes into both the n-type semiconductor region and the p-type semiconductor region.

20. A process according to claim 19, wherein the n-type impurity is implanted, and annealing is performed, such that the n-type impurity in the p-type semiconductor region does not extend deeper than the p-type semiconductor region.

21. A process according to claim 18, wherein the n-type impurity is implanted into at least the n-type semiconductor region so as to provide a further semiconductor region having a smaller impurity concentration than that of the n-type semiconductor region.

22. A process according to claim 15, including the further steps of forming wiring layers over the semiconductor substrate, said first insulating film being formed so as to cover said wiring layers, and wherein the step of forming at least two contact holes in said first insulating film forms contact holes to said wiring layers.

23. A process according to claim 22, wherein the step of ion-implanting the n-type impurity introduces the n-type impurity into the wiring layers as well as into the n-type semiconductor region.

24. A process according to claim 23, wherein the n-type impurity is ion-implanted at a concentration lower than the concentration of the p-type impurity in the p-type semiconductor region.

25. A process according to claim 24, wherein the n-type impurity is ion-implanted through the at least two contact holes into both the n-type semiconductor region and the p-type semiconductor region.

26. A process according to claim 15, wherein, after forming the contact holes, a second insulating film is formed on the surfaces exposed by the contact holes.

27. A process according to claim 26, wherein the second insulating film is formed after forming the contact holes and before ion-implanting the n-type impurity, the n-type impurity being implanted through the second insulating film, and wherein the process further comprises the step of forming a mask for said non-implantation, said mask covering at least said contact hole to said p-type semiconductor region, and wherein said ion-implantation is conducted by using said mask.

28. A process according to claim 26, wherein the second insulating film is removed after said annealing and prior to said forming the conductive film.

29. A process according to claim 26, wherein the second insulating film is a thermal oxide film.

30. A process according to claim 26, wherein the second insulating film is made of silicon oxide formed by chemical vapor deposition or silicon nitride formed by chemical vapor deposition.

31. A process according to claim 15, wherein said first insulating film also covers a second conductive layer formed over said main surface of said semiconductor substrate, and said at least two contact holes include contact holes formed to said second conductive layer.

32. A process according to claim 31, wherein said second conductive layer is formed of polycrystalline silicon.

33. A process according to claim 15, wherein said N-channel MOSFET and said P-channel MOSFET constitute complementary MOSFETs of said semiconductor integrated circuit device.

34. A process according to claim 15, wherein said conductive film is comprised of a metal wiring layer which contains aluminum.

35. A process according to claim 15, wherein the N-channel MOSFET is provided on a p-type well region which is disposed in the main surface of the semiconductor substrate, the P-channel MOSFET is provided on an n-type well region which is disposed in the main surface of the semiconductor substrate.

36. A process according to claim 15, wherein said p-type semiconductor region has a deeper junction depth than that of said n-type semiconductor region.

37. A process for fabricating a semiconductor integrated circuit device, comprising the steps of:
  forming a first insulating film covering an N-channel MOSFET having n-type semiconductor regions and a P-channel MOSFET having p-type semiconductor regions, the MOSFETs being provided on a main surface of a semiconductor substrate, said n-type semiconductor regions and p-type semiconductor regions being disposed in the semiconductor substrate;
  simultaneously forming at least two contact holes in said first insulating film, said at least two contact holes being formed to at least each of an n-type semiconductor region of the N-channel MOSFET and a p-type semiconductor region of the P-channel MOSFET;
  selectively forming a mask covering at least one contact hole, of the contact holes, to said p-type semiconductor region of the P-channel MOSFET;
  introducing an n-type impurity into at least said n-type semiconductor region through at least one contact hole, of the contact holes, by ion-implantation using said mask so as to provide a further n-type semiconductor region which has a deeper junction depth than that of said n-type semiconductor region;
  removing the mask; and
  forming a metal layer, which contains aluminum, in the contact holes to both the n-type and the p-type semiconductor regions.

* * * * *